United States Patent
Baselmans et al.

(10) Patent No.: US 7,183,566 B2
(45) Date of Patent: Feb. 27, 2007

(54) LITHOGRAPHIC APPARATUS FOR MANUFACTURING A DEVICE

(75) Inventors: Johannes Jacobus Matheus Baselmans, Oirschot (NL); Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 237 days.

(21) Appl. No.: 10/848,583

(22) Filed: May 19, 2004

(65) Prior Publication Data

US 2005/0006563 A1 Jan. 13, 2005

(30) Foreign Application Priority Data

May 28, 2003 (EP) ................... 03253333

(51) Int. Cl.
  *G01N 21/86* (2006.01)
  *G03B 27/42* (2006.01)
  *G03B 27/54* (2006.01)

(52) U.S. Cl. ............................ 250/548; 355/53; 355/67

(58) Field of Classification Search ................ 250/548, 250/208.1; 355/53, 67, 77
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,057,538 A * | 5/2000 | Clarke | 250/208.1 |
| 6,121,626 A | 9/2000 | Lin | |
| 6,133,986 A | 10/2000 | Johnson | |
| 6,177,980 B1 | 1/2001 | Johnson | |
| 6,486,939 B2 | 11/2002 | Lin | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2003/0081303 A1 | 5/2003 | Sandstorm et al. | |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| WO | WO 98/33096 | 7/1998 |
|---|---|---|
| WO | WO 98/38597 | 9/1998 |
| WO | WO 03/046665 A1 | 6/2003 |

OTHER PUBLICATIONS

European Search Report for European Appln. 03253333.3 mailed Apr. 14, 2004.

* cited by examiner

*Primary Examiner*—Stephone B. Allen
*Assistant Examiner*—Suezu Ellis
(74) *Attorney, Agent, or Firm*—Sterne, Kessler, Goldstein & Fox P.L.L.C.

(57) ABSTRACT

To calibrate a lithographic apparatus having a programmable patterning means, a sensor, such as a CCD, CMOS sensor or photo-diode array, having detector elements larger than the size of a spot corresponding to a single pixel of the programmable patterning means is used. Pixels are selectively activated singly or in groups.

15 Claims, 3 Drawing Sheets

LITHOGRAPHIC APPARATUS FOR MANUFACTURING A DEVICE

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the projection beam in a given direction (the "scanning"-direction), while synchronously scanning the substrate parallel or anti-parallel to this direction.

In a lithographic apparatus using a programmable patterning means, several additional calibrations, as compared to a machine using a conventional mask, must be carried out. For example, it is necessary to measure the intensity of the radiation delivered to the substrate for each element (e.g., pixel) of the programmable patterning means. The size and position of each spot projected onto the substrate must also be measured. Given the very large number of elements in a programmable patterning means, potentially tens of millions, such pixel-by-pixel calibrations take an excessive length of time and represent a substantial reduction in throughput if it is necessary to repeat them periodically.

In a lithographic apparatus for forming very fine patterns, particularly one employing a reducing projection system, the calibration is also very difficult as the spot projected onto the substrate for each pixel is extremely small, much smaller than any detector, even the individual elements of a charge coupled device (CCD). It should be noted that the spot size on the substrate is determined by the projection optics and may be larger than the geometric image of a single pixel of the programmable patterning means, depending on the value of a k1 factor. K1 is a process factor depending on the coherence of a light source. For example, K1 is 0.25 and 0.5 for incoherent and coherent illumination, respectively.

Carrying out a series of test exposures and measuring the results can be done, but is very time consuming, and hence impracticable for periodic recalibration. It has therefore been proposed to carry out calibration measurements at an intermediate image plane of the projection lens, e.g., by providing a semi-transparent mirror to direct a portion of the beam to a detector or by providing a detector that can be moved into and out of the beam. For examples of this former method see U.S. Published patent application Ser. No. 2003/0081303 A1 and WO 03/046665, which are both incorporated by reference herein in their entireties. An intermediate image plane where the image is much larger than that projected onto the substrate can be chosen. However, a semi-transparent mirror will inevitably degrade the projected image to some extent and providing the space and mechanism for a moveable detector in the projection lens may not be convenient. Also, measurements at an intermediate image plane cannot take account of the effects of subsequent elements of the projection lens.

U.S. Pat. No. 6,121,626 and US 2001/0033996A disclose lithographic apparatus using a transmissive dynamic mask and a CCD mounted on the wafer stage, which are both incorporated by reference herein in their entireties. The CCD image is compared to the desired image to optimize the pattern on the dynamic mask as well as focus, dose, numerical aperture (NA), and C settings.

Therefore, what is needed is an apparatus and method that allow for more rapid and reliable calibration of a programmable patterning device, for example using measurements made at substrate level.

SUMMARY OF THE INVENTION

One embodiment of the present invention provides a lithographic apparatus comprising an illumination system for supplying a projection beam of radiation, an array of individually controllable elements serving to impart the projection beam with a pattern, a substrate table for supporting a substrate, and a projection system for projecting the patterned beam onto a target portion of the substrate. The lithographic apparatus also comprises a detector positionable in the projected patterned beam in place of the substrate and having a plurality of detector elements, each detector element being larger than a spot corresponding to a single pixel of the programmable patterning means.

Appropriate selective activation of the elements (pixels) of the array enables use of a detector having detector elements much larger than the spots projected corresponding to each pixel. The pixels may be activated singly or in patterns to calibrate them individually or to detect changes. Between successive activation and detection cycles, the detector can be moved, either to enable a smaller detector to be used to calibrate a larger array or to improve calibration of pixels on or near the borders between detector elements.

In one example, the detector is mounted on the substrate table enabling it to be positioned in the projection beam with the already existing positioning system for the substrate table.

In one example, the detector comprises a CCD, a CMOS sensor, a photo-diode array, or similar sensing devices.

In one example, the detector further comprises an aperture member having a plurality of apertures corresponding to the plurality of detector elements, each aperture being larger than the spot projected onto the detector and corresponding to a single pixel. For example, each aperture is larger than ten times the size of the projected spot and/or smaller than 75% of the size of a detector element. The aperture member enables crosstalk between pixels to be reduced.

In one example, the detector further comprises a microlens array, each microlens of the microlens array serving to spread the radiation corresponding to a single pixel across one or more of the detector elements. The microlens array enables the sensitivity of measurements to be increased.

Another embodiment of the present invention provides a device manufacturing method comprising the steps of providing a substrate, providing a projection beam of radiation using an illumination system, an array of individually controllable elements to impart a pattern to the projection beam, and projecting the patterned beam of radiation onto a target portion of the substrate. Prior to the step of using array of individually controllable elements, the array is calibrated.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

In the Figures, corresponding reference symbols can indicate corresponding parts.

DETAILED DESCRIPTION OF THE EMBODIMENTS

Terminology

Figure 1:
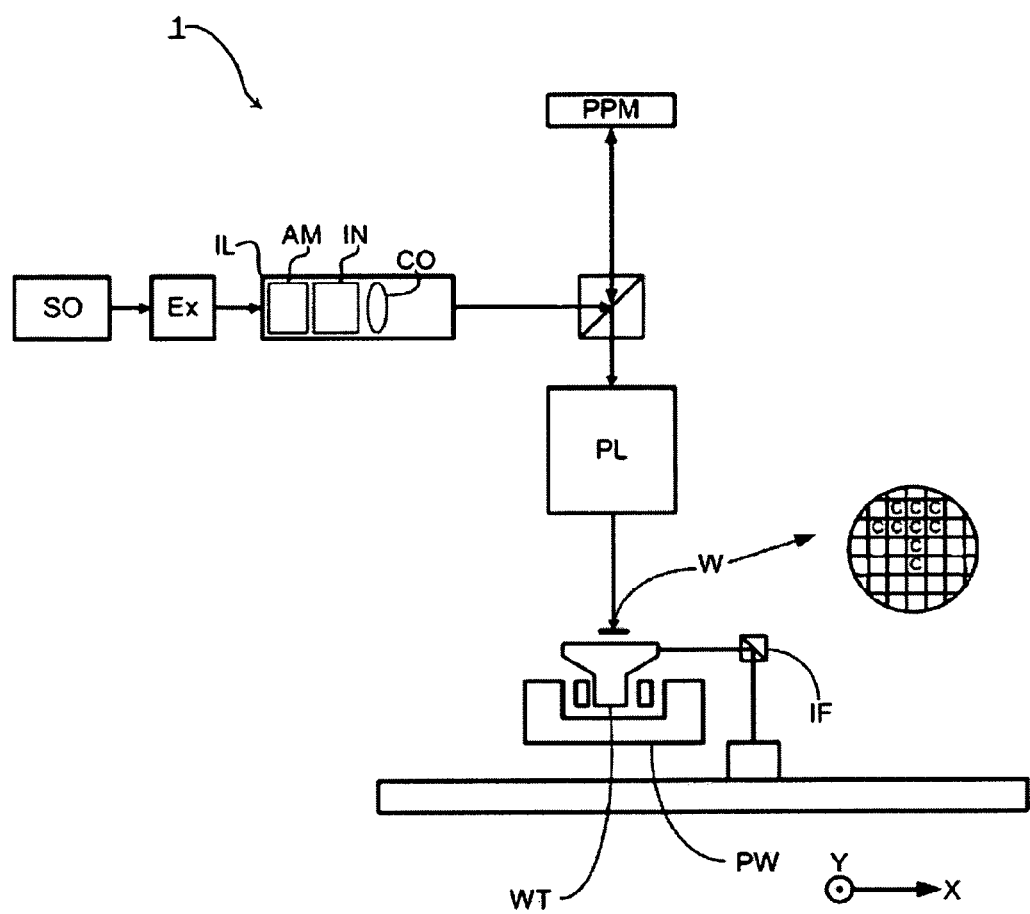
FIG. 1 depicts a lithographic projection apparatus according to a first embodiment of the invention.

The term "array of individually controllable elements" as here employed should be broadly interpreted as referring to any device that can be used to endow an incoming radiation beam with a patterned cross-section, so that a desired pattern can be created in a target portion of the substrate; the terms "light valve" and "Spatial Light Modulator" (SLM) can also be used in this context. Examples of such patterning devices include a programmable mirror array and a programmable liquid crystal display (LCD) array, discussed below.

A programmable mirror array may comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter may filter out the diffracted light, leaving the undiffracted light to reach the substrate.

An array of diffractive optical Micro Electro-Mechanical Systems (MEMS) devices can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In the situations described above, the array of individually controllable elements can comprise one or more programmable mirror arrays. More information on mirror arrays as here referred to can be gleaned, for example, from U.S. Pat. Nos. 5,296,891 and 5,523,193 and PCT patent applications WO 98/38597 and WO 98/33096, which are incorporated herein by reference in their entireties.

An example programmable LCD array construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 408, 355, 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including, but not limited to, refractive, reflective, and catadioptric optical components for directing, shaping, or controlling the projection beam of radiation, and such components may also be referred to below, collectively or singularly, as a "lens".

The lithographic apparatus may be of a type having two (e.g., dual stage) or more substrate tables. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the array of individually controllable elements and the first element of the projection system. Immersion techniques are well known in the art for increasing the numerical aperture of projection systems.

Overall System

FIG. 1 schematically depicts a lithographic projection apparatus, according to one embodiment of the invention. In this embodiment, the apparatus comprises the following elements. An illumination system (illuminator) IL for providing a projection beam PB of radiation (e.g., UV radiation). An array of individually controllable elements PPM (e.g., a programmable mirror array) for applying a pattern to the projection beam. In general, the position of the array of individually controllable elements will be fixed relative to item PL. However, it may instead be connected to a positioning means for accurately positioning it with respect to item PL. A substrate table (e.g., a wafer table) WT for supporting a substrate (e.g., a resist-coated wafer) W, and connected to positioning means PW for accurately positioning the substrate with respect to item PL. A projection system ("lens") PL for imaging a pattern imparted to the projection beam PB by the array of individually controllable elements PPM onto a target portion C (e.g. comprising one or more dies) of the substrate W. The projection system may image the array of individually controllable elements onto the substrate. Alternatively, the projection system may image secondary sources for which the elements of the array of individually controllable elements act as shutters. The projection system may also comprise an array of focusing elements, such as a micro lens array (MLA) or a Fresnel lens array to form the secondary sources and to image microspots onto the substrate.

As here depicted, the apparatus is of a reflective type because it has a reflective array of individually controllable elements). However, it may also be of a transmissive type, for example with a transmissive array of individually controllable elements. The illuminator IL receives a beam of radiation from a radiation source SO.

In one example, the source SO and the lithographic apparatus may be separate devices, for example when the source is an excimer laser. The source SO is not considered to form part of the lithographic apparatus and the radiation beam is passed from the source SO to the illuminator IL with the aid of a beam delivery system BD comprising, for example, but not limited to, suitable directing mirrors and/or a beam expander Ex.

In other examples, the source SO may be integral part of the apparatus, for example when the source is a mercury lamp. The source SO and the illuminator IL, together with the beam delivery system BD, if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator IL can be adjusted. In addition, the illuminator IL generally comprises various other components, such as an integrator IN and a condenser CO. The illuminator IL provides a conditioned beam of radiation, referred to as the projection beam PB, having a desired uniformity and intensity distribution in its cross-section.

The projection beam PB subsequently intercepts the array of individually controllable elements PPM. Having been reflected by the array of individually controllable elements PPM, the patterned projection beam PB passes through the projection system PL, which focuses the patterned projection beam PB onto a target portion C of the substrate W. With the aid of the positioning means PW, and optionally an interferometric measuring means IF, the substrate table WT can be moved accurately, e.g., so as to position different target portions C in the path of the beam PB.

In one example, a positioning means for the array of individually controllable elements PPM can be used to accurately correct the position of the array of individually controllable elements PPM with respect to the path of the beam PB, e.g., during a scan. In general, movement of the object table WT is realized with the aid of a long-stroke module (course positioning) (not shown) and a short-stroke module (fine positioning) (not shown). It is to be appreciated that a similar positioning system may also be used to position the array of individually controllable elements.

It will be appreciated that the a path of the projection beam PB may alternatively/additionally move, while the object table WT and/or the array of individually controllable elements PPM may have a fixed position to provide the required relative movement.

As a further alternative, that may be especially applicable in the manufacture of flat panel displays, the position of the substrate table WT and the projection system PL may be fixed and the substrate W may be arranged to be moved relative to the substrate table WT. For example, the substrate table WT may be provided with a system for scanning the substrate W across it at a substantially constant velocity.

Although the lithography apparatus according to the invention is herein described as being for exposing a resist on a substrate, it will be appreciated that the invention is not limited to this use and the apparatus may be used to project a patterned projection beam for use in resistless lithography.

The depicted apparatus can be used in four preferred modes:

1. Step mode: the array of individually controllable elements PPM imparts an entire pattern to the projection beam PB, which is projected onto a target portion C during one exposure (i.e., a single static exposure). The substrate table WT is then shifted in the X and/or Y direction so that a different target portion C can be exposed. In step mode, the maximum size of the exposure field limits the size of the target portion C imaged in a single static exposure.

2. Scan mode: the array of individually controllable elements PPM is movable in a given direction (the so-called "scan direction", e.g. the Y direction) with a speed v, so that the projection beam PB is caused to scan over the array of individually controllable elements PPM. Concurrently, the substrate table WT is simultaneously moved in the same or opposite direction at a speed V=Mv, in which M is the magnification of the lens PL. In scan mode, the maximum size of the exposure field limits the width (in the non-scanning direction) of the target portion in a single dynamic exposure, whereas the length of the scanning motion determines the height (in the scanning direction) of the target portion.

3. Pulse mode: the array of individually controllable elements PPM is kept essentially stationary and the entire pattern is projected onto a target portion C of the substrate W using a pulsed radiation source SO. The substrate table WT is moved with an essentially constant speed such that the projection beam PB is caused to scan a line across the substrate W. The pattern on the array of individually controllable elements PPM is updated as required between pulses of the radiation system. The pulses are timed such that successive target portions C are exposed at the required locations on the substrate. Consequently, the patterned projection beam PB can scan across the substrate W to expose the complete pattern for a strip of the substrate W. The process is repeated until the complete substrate W has been exposed line by line.

4. Continuous scan mode: essentially the same as pulse mode, except that a substantially constant radiation source SO is used and the pattern on the array of individually controllable elements PPM is updated as the patterned projection beam PB scans across the substrate W and exposes it.

Combinations and/or variations on the above described modes of uses or entirely different modes of use may also be employed.

First Exemplary Detector Arrangement

Figure 2:
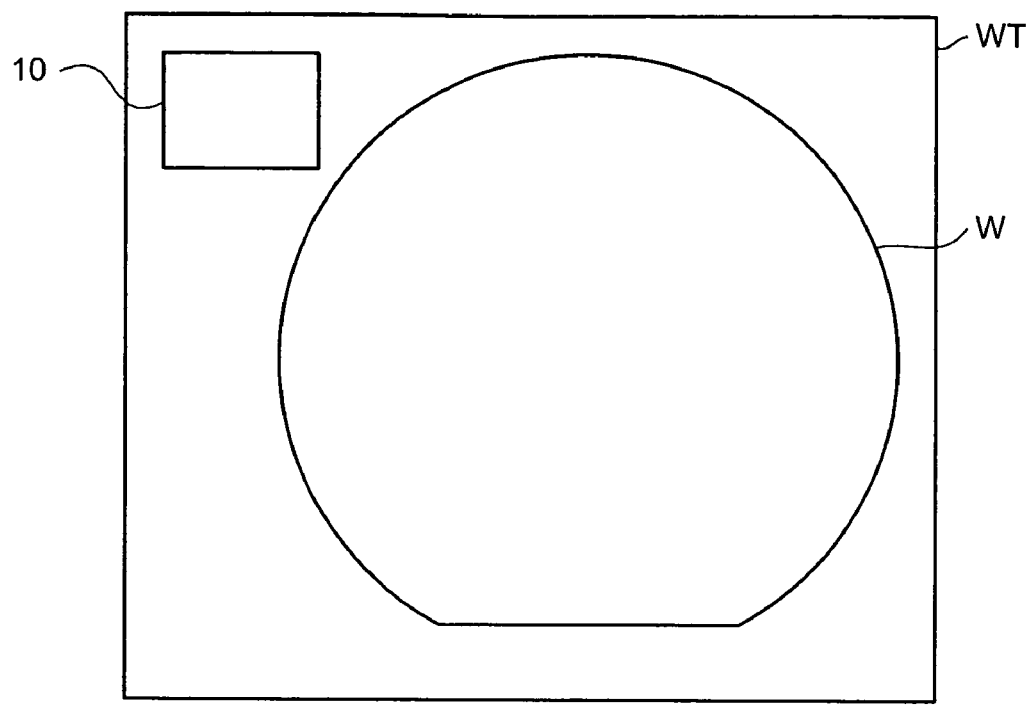
FIG. 2 depicts the substrate table of FIG. 1 including a calibration detector.

FIG. 2 shows the substrate table WT carrying a substrate W mounted in a substrate holder (not shown) and a pixel calibration detector 10 that comprises an array of individual detecting elements 11, according to one embodiment of the present invention. The pixel calibration detector 10 may be a CCD, Complementary Metal Oxide Semiconductor (CMOS) sensor, a photo-diode array, or other suitable device.

Where the radiation of the projection beam PB is at a wavelength, such as DUV, that would damage the detector 10, a conversion layer (not shown) may be placed over the detector 10. The conversion layer converts, e.g., by fluorescence, the photons of the short wavelength exposure radiation to visible light which the detector 10 can detect without suffering damage.

In this example, the pixel calibration detector 10 is fixed to the substrate table WT adjacent the substrate holder, but a removable detector, for example, mounted on a dummy substrate which can be held by the substrate holder, may also be employed. It is also possible to provide a separate positioning system to position the detector 10 under the projection lens PL when required. However, this example uses the substrate table, for which accurate positioning and displacement measuring systems are already provided. In a multiple stage apparatus, only one stage WT need be provided with a pixel calibration detector 10. The pixel calibration detector 10 may also be used to make other measurements that are not further discussed herein.

Figure 3:
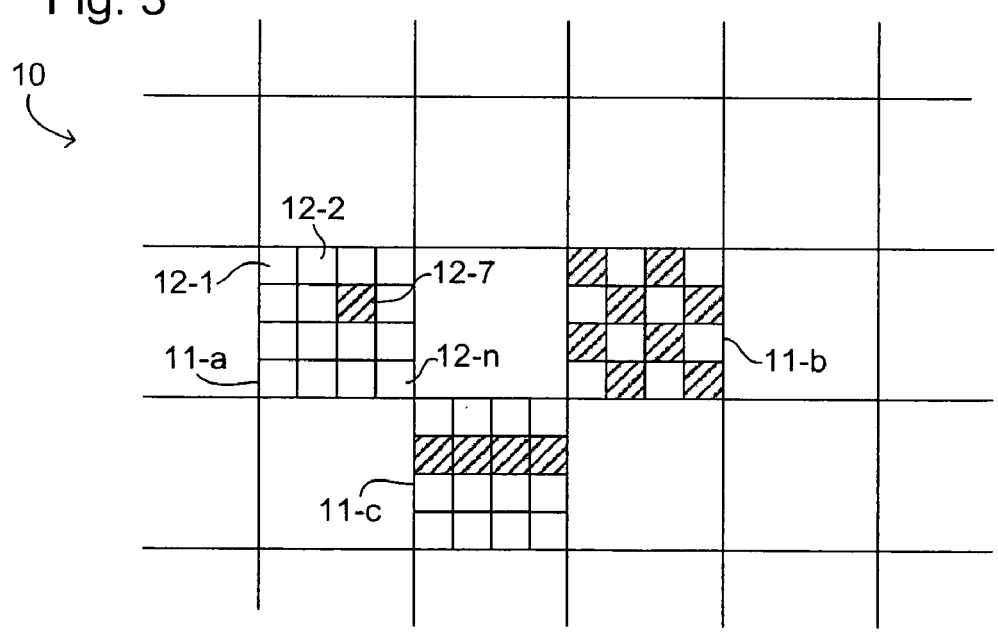
FIG. 3 illustrates the relationship between projected spots and detector elements in FIGS. 1 and 2.

FIG. 3 shows arrangements of spots 12 within detecting elements 11, according to one embodiment of the present invention. Each detecting element 11 is larger than a spot 12 projected onto the substrate W corresponding to a single element of the array of individually controllable elements PPM. For example, an array of spots 12-1 to 12-n within each detecting element 11 can be separately irradiated by appropriate control of the corresponding pixels of the array of individually controllable elements PPM.

Exemplary PPM Calibration Methods

In one embodiment of the present invention, a calibration method is carried out by activating the pixels of the array of individually controllable elements PPM in sequence so that each detector element 11 is only irradiated by one pixel at a time. The outputs of the elements 11 of the detector 10 are correlated to the sequence of activation of the pixels of the array of individually controllable elements PPM to provide a pixel-by-pixel intensity measurement which can be used for calibration. The detector 10 does not need to be moved during the sequence of measurements, so that the speed of the calibration is limited only by the switching speed of the of individually controllable elements PPM and the sensitivity and readout speed of the detector 10. Thus a suitably sensitive and fast sensor 10 can enable a rapid calibration of the of individually controllable elements PPM.

In another embodiment of the present invention, during a second calibration method after an initial calibration of the array of individually controllable elements PPM, the pixel-by-pixel measurements can be stored as reference values to enable a more rapid detection of changes. In this second method, several pixels corresponding to each detector element 11 are activated at once and the resulting output is compared to the sum of the corresponding reference values. Any difference indicates that a change has occurred and a sequence of measurements can then be carried out to determine which of the pixels has been affected.

In one example, identifying which of a group of pixels has caused a detected variation is done by activating a first half of the pixels in the group, e.g., as shown for detector element 11-b in FIG. 3, and compare the output of the detector element 11 to the summed corresponding reference values. If no change is detected in that step, the variation can be attributed to the second half of the original group. On the other hand, if a change accounting for the whole of the originally detected change is detected, the variation is attributed to the first half. Then, half of the half to which the change has been attributed is considered and so on until the change can be attributed to single pixels whose reference calibration values are amended accordingly. This method is akin to a binary tree search.

In this second method of the invention, two or more cycles may be carried out with the pixels differently grouped, e.g. by line as shown for detector element 11-c, to reduce the chance that variations in two or more pixels cancel each other out and hence go undetected.

Other Exemplary Detector Arrangements

Figure 4:
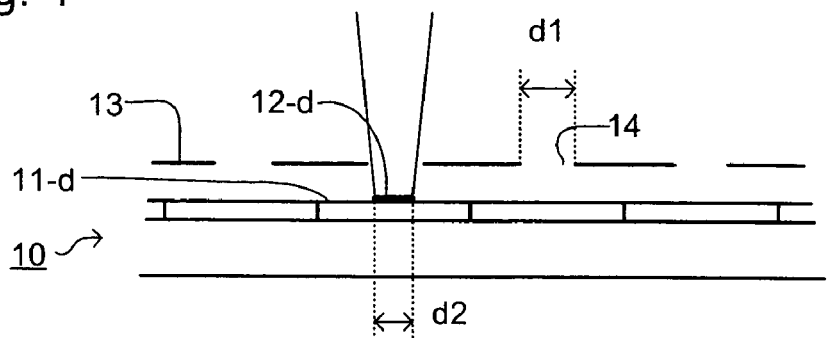
FIGS. 4 to 6 illustrate detectors used in second and third embodiments of the invention.

FIG. 4 shows a detector arrangement, according to another embodiment of the present invention. The embodiment shown in FIG. 4 is similar to embodiments described above, except an aperture member 13 is used to reduce crosstalk in the detector 10. Aperture member 13 is located above the detector 10 and has one aperture 14 for each of the detector elements 11. Each aperture 14 is shaped and sized to ensure that all of the light directed to the substrate W from one pixel of the array of individually controllable elements PPM reaches the detector 10, but that as little other light as possible does. For example, if each pixel of the array of individually controllable elements PPM creates a square spot on the substrate W of size d2, each aperture 14 may also be square with size d1, where d1>d2. The amount by which d1 is greater than d2 must be sufficient to encompass the possible variation in spot sizes.

The aperture member 13 may be a separate plate member or a layer deposited on the surface of detector 10. In either case, the aperture member should be a suitable material and of sufficient thickness to be effectively opaque to the radiation of the patterned projection beam PB. The apertures 14 can be created with the required positioning and size accuracy by lithographic techniques, e.g., by using a high dose to expose a larger than normal region using a single pixel or by overetching.

When using a detector 10 with an aperture member 13, the detector 10 will need to be shifted to align the aperture 14 with the spots projected from the different pixels to be calibrated. However, if the spacing of the aperture 14 correctly matches the spacing of projected spots, the number of movements is only equal to the number of pixels in the array of individually controllable elements PPM per detecting element 11 and need not cause an undue increase in the length of time taken for the calibration.

With the aperture layer, only light from a selected pixel reaches the detector element 11, so the effects of stray light, seriously misaligned pixels or pixels stuck in the "on" position can be eliminated.

Figure 5:
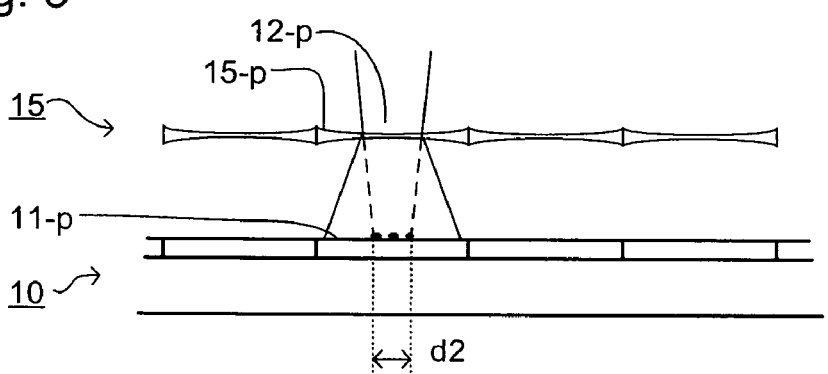
Figure 6:
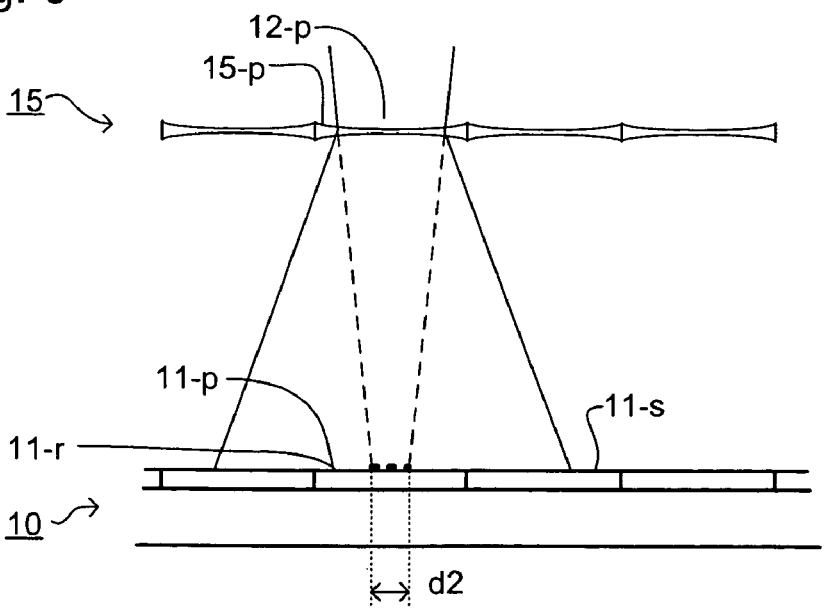

FIGS. 5 and 6 shows other detector arrangements, according to further embodiments of the present invention. In these embodiments, a microlens array 15 is used to spread out the patterned projection beam from a selected pixel to improve the sensitivity of the sensor 10. The microlens array 15 can be employed to spread the light across a single detector element 11-p, as shown in FIG. 5, or across several elements 11-p to 11-s, as shown in FIG. 6. By directing light more evenly across a detector element 11, localized damage to the detector 10 is avoided and bloom, or local overloading of the detector, is reduced.

Spreading the light across several detector elements 11 can be useful where the intensity of a spot is high and risks overloading a single detector element 11. It also allows for longer "exposures" to increase sensitivity and can enable a measurement of the size and position of the spot by comparison of the intensities recorded by the several detector elements 11 receiving light from the spot.

The microlens array 15 may also be used in combination with an aperture member 13, as discussed above. If the aperture member 13 is a deposited layer, it may be provided on the microlens array 15 rather than the detector 10.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
an illumination system that supplies a projection beam of radiation;
an array of individually controllable elements that patterns the projection beam;
a substrate table that includes an area for supporting a substrate;
a projection system that projects the patterned projection beam onto a target portion of the substrate; and
a detector moveable to a position that is in a path of the patterned projection beam and substantially in the area of the substrate table for supporting the substrate, the detector having detector elements, each of the detector elements being larger than a spot corresponding to a single pixel of the array of individually controllable elements.

2. The lithographic apparatus of claim 1, wherein the detector is mounted on the substrate table.

3. The lithographic apparatus of claim 1, wherein the detector comprises a charge coupled device (CCD), a Complementary Metal Oxide Semiconductor (CMOS) sensor, or a photo-diode array.

4. The lithography apparatus of claim 1, wherein the detector further comprises an aperture member having an aperture for each corresponding one of the detector elements.

5. The lithography apparatus of claim 4, wherein each of the apertures is larger than the spot that corresponded to the single pixel of the array of individually controllable elements.

6. The lithography apparatus of claim 4, wherein each of the apertures is larger than ten times the size of the spot.

7. The lithographic apparatus of claim 4, wherein each of the apertures is smaller than about 75% of a size of each of the detector elements.

8. The lithographic apparatus of claim 1, wherein the detector further comprises a microlens array, wherein each microlens of the microlens array spreads the radiation corresponding to a single element of the array of individually controllable elements across one or more of the detector elements.

9. A lithographic apparatus, comprising:
an illumination system configured to supply a beam of radiation;
an array of individually controllable elements, each of the individually controllable elements defining a pixel, the array being configured to pattern the beam of radiation;
a projection system configured to project the patterned beam onto a target portion of a substrate; and
a detector comprising,
detector elements, and
a microlens array,
wherein the detector is moveable to a position that is in a path of the patterned beam,
wherein each of the detector elements is larger than a spot created by a corresponding one of the pixels, and
wherein each microlens of the microlens array spreads the spot created by the corresponding one of the pixels across one or more of the detector elements.

10. The lithographic apparatus of claim 9, wherein the detector is mounted on a substrate table.

11. The lithographic apparatus of claim 9, wherein the detector comprises a charge coupled device (CCD), a Complementary Metal Oxide Semiconductor (CMOS) sensor, or a photo-diode array.

12. The lithography apparatus of claim 9, wherein the detector further comprises:
an aperture member including an aperture for each corresponding one of the detector elements.

13. The lithography apparatus of claim 12, wherein each of the apertures is larger than the spot.

14. The lithography apparatus of claim 12, wherein each of the apertures is larger than ten times the size of the spot.

15. The lithographic apparatus of claim 12, wherein each of the apertures is smaller than about 75% of a size of each of the detector elements.

* * * * *

UNITED STATES PATENT AND TRADEMARK OFFICE
CERTIFICATE OF CORRECTION

| | |
|---|---|
| PATENT NO. | : 7,183,566 B2 |
| APPLICATION NO. | : 10/848583 |
| DATED | : February 27, 2007 |
| INVENTOR(S) | : Baselmans et al. |

It is certified that error appears in the above-identified patent and that said Letters Patent is hereby corrected as shown below:

Column 10
Line 26-27 please replace "element of the array of individually controllable elements across" with --element of the microlens array across--.

Signed and Sealed this

Fifteenth Day of May, 2007

JON W. DUDAS
*Director of the United States Patent and Trademark Office*